United States Patent [19]

Burkness

[11] Patent Number: 4,680,761
[45] Date of Patent: Jul. 14, 1987

[54] SELF DIAGNOSTIC CYCLIC ANALYSIS TESTING SYSTEM (CATS) FOR LSI/VLSI

[76] Inventor: Donald C. Burkness, 1709 Glenkarney Pl., Silver Spring, Md. 20902

[21] Appl. No.: 824,223

[22] Filed: Jan. 30, 1986

[51] Int. Cl.$^4$ ............................................. G01R 31/28
[52] U.S. Cl. .................................... 371/25; 324/73 R
[58] Field of Search .................. 371/25, 15; 324/73 R, 324/73 AT

[56] References Cited

U.S. PATENT DOCUMENTS

| | | | |
|---|---|---|---|
| 3,761,695 | 9/1973 | Eichelberger | 371/25 |
| 4,225,957 | 9/1980 | Doty et al. | 371/25 X |
| 4,244,048 | 1/1981 | Tsui | 371/25 X |
| 4,298,980 | 11/1981 | Hajdu et al. | 371/25 |
| 4,441,075 | 4/1984 | McMahon | 324/73 R |
| 4,476,431 | 10/1984 | Blum | 371/25 X |
| 4,493,077 | 1/1985 | Agrawal et al. | 371/25 |
| 4,503,537 | 3/1985 | McAnney | 371/25 |
| 4,513,418 | 4/1985 | Bardell et al. | 371/25 |
| 4,519,078 | 5/1985 | Komonytsky | 371/25 |

OTHER PUBLICATIONS

Blum, Self-Testing Mechanism, IBM Technical Disclosure Bulletin, vol. 26, No. 10B, Mar. 1984, pp. 5566-5570.

LeBlanc, LOCST: A Build-In Self-Test Techique, IEEE Design & Test, Nov. 1984, pp. 45-52.

Konemann et al., Built-In Test for Complex Digital Integrated Circuits, Fifth European Solid State Circuits Conference, Southampton, England, 18-21 Sep. 1979, pp. 89-90.

Guterl, Fred, "The One-Month Chip: Testing", IEEE Spectrum, Sep. 1984, pp. 40-46.

Lyman, Jerry, "Expert Systems Tackle VLSI Testing", Electronics, Nov. 25, 1985, pp. 56-57.

Primary Examiner—Charles E. Atkinson
Attorney, Agent, or Firm—Laubscher & Laubscher

[57] ABSTRACT

A novel self diagnostic Cyclic Analysis Testing System (CATS) for functional testing of integrated circuit boards, and assemblies is disclosed, wherein a logic device under test is isolated and reconfigured to simulate a non-linear binary sequence generator which has known settings during normal fault free operation. The memory elements of the logic under test are preset to a known start setting, and the device is clocked for a given number of steps to define a testing cycle to operate the logic gates and memory elements of the device under test as the non-linear sequence generator. At the end of the testing cycle, the settings of the memory elements are compared with the known settings, and a fault condition is indicated when the setting(s) differ from the known setting.

16 Claims, 13 Drawing Figures

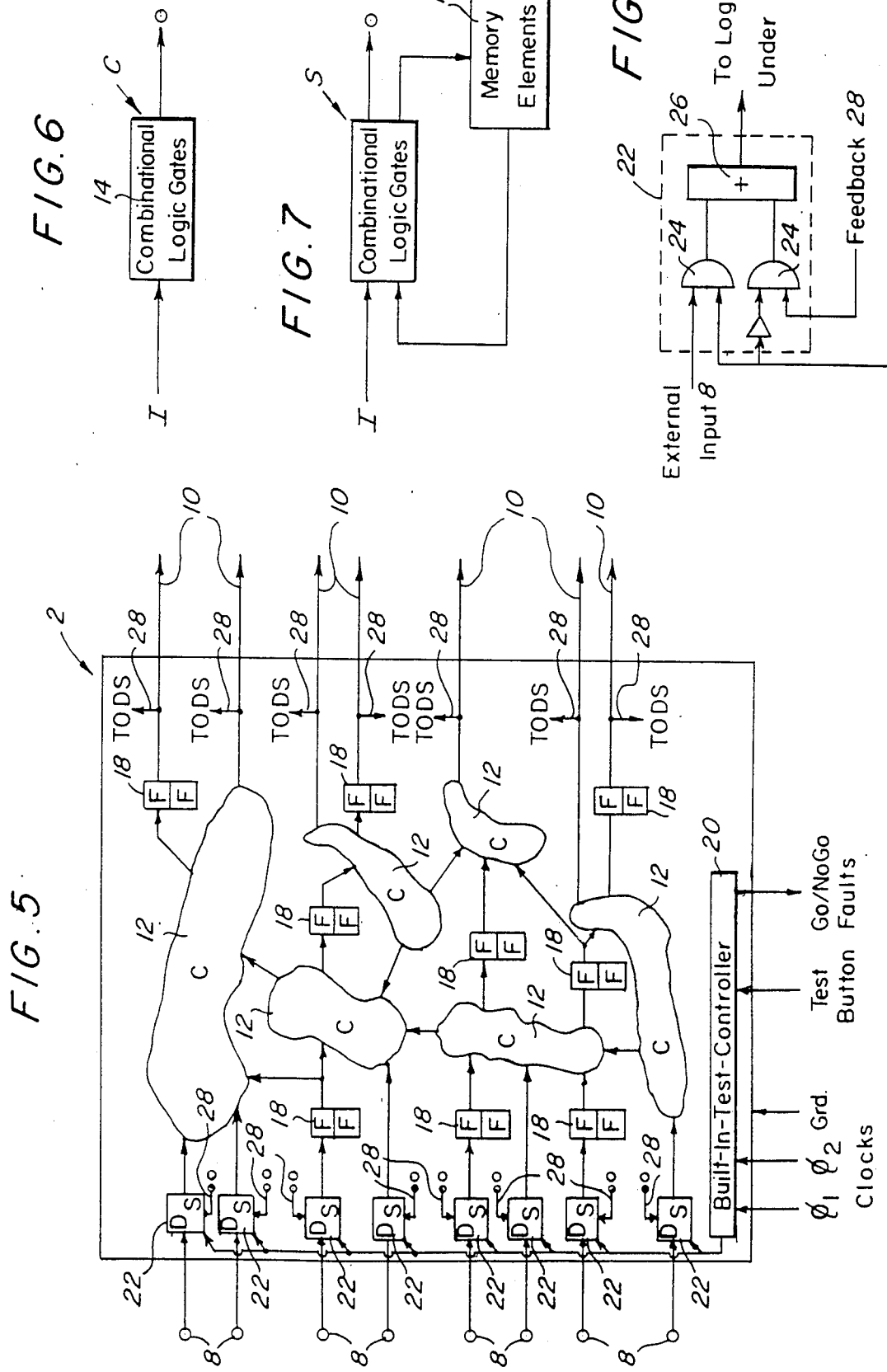

SELF DIAGNOSTIC CYCLIC ANALYSIS TESTING SYSTEM (CATS) FOR LSI/VLSI

BACKGROUND OF THE INVENTION

Testing, test equipment, and associated support personnel are major factors in the cost of all digital electronic components, equipment, and systems. These costs can vary from as low as twenty percent of the purchase price of a component up to three hundred percent or more of the price of a system during its operational lifetime. In addition to these substantial costs, it is very difficult to recruit, train and maintain a skilled and knowledgeable testing work force. These needs are becoming more critical as digital electronic systems are becoming an essential part of our society. Digital systems such as telephones, computers, and control networks must be maintained with a minimum of down time. New requirements are placing greater emphasis on the need for fault-free systems which can maintain their function and reliability at all times. Self-testing and automatic repair, therefore, are rapidly becoming an important objective of our advanced digital system designs.

The need for improved testing methodologies has been recognized for many years. As a result, a number of engineering approaches have been developed to alleviate or minimize these problems with varying degrees of success. Naturally, the cost effectiveness of different techniques will vary with the criticality and importance of the application, but satisfactory overall solutions have not been developed to date. The goals for testing complex digital circuits, equipment, and systems include:

1. a desire to test every active device (i.e. transistors, diodes, etc.) individually in its active (on) and inactive (off) state;
2. a desire to test the operation of inactive devices (i.e. resistors, capacitors, etc.);
3. a desire to test that all interconnecting wires are without shorts or opens;
4. a desire to test circuits in all of their logic states (ands, ors, nors, etc.); and
5. a desire to test complex operations at normal operational speeds (clock rates) to detect delay faults.

The effectiveness of a test is normally measured in a ratio of the number of tests performed compared to the total available and is given as a percent. A standard methodology in making these calculations is normally not observed, but current goals for testing large scale integrated circuits are to reach a test effectiveness of 95 percent or better. Naturally, the goal for all critical systems is to reach 100 percent or as close to it as possible. Other desirable features are:

1. minimizing the need for development and deployment of special test equipment;
2. providing low complexity built-in-test equipment (BITE);
3. the ability to detect multiple faults including any faults in the added test logic; and
4. performing the testing without disassembly of the equipment (i.e. in situ).

Currently, all components and assemblies are tested individually during manufacture. Then, as they are assembled, they are tested as equipment, sub-systems, and systems. Unfortunately, as the system complexity increases, the ability to test for faults is reduced dramatically. The lack of testability in an operational configuration requires disassembly for testing with special testers, a very undesirable feature of current systems. Accordingly, the prime thrust of the electronics industry is to develop improved test procedures.

Conventional methods for testing separate digital components or assemblies utilize the measurement of their electrical characteristics (output voltages, currents, etc.) against specified values plus functional analysis of the systems logic by exercising the unit with digital test patterns. These digital test patterns are normally provided as inputs and as check patterns to test against the outputs. This logic test procedure is expensive and begins to break down as the functional complexity of the circuit increases compared to the number of input/output lines. This is recognized by the industry as a major unsolved problem currently associated with the testing of Large Scale (LSI) and Very Large Scale Integrated (VLSI) circuits.

Ever since the inception of digital electronics, practical methods of providing built-in-test equipment (BITE) have also been proposed and evaluated with limited success. Basically, the levels of fault analysis of these systems have been relatively poor compared to the additional system complexity required to carry them through to a successful completion.

BRIEF DESCRIPTION OF THE PRIOR ART

Testing systems for integrated circuits and circuit chips are known in the art as evidenced by the following U.S. patents:

| | |
|---|---|
| 3,761,695 | Eichelberger |
| 4,225,957 | Doty, Jr. et al |
| 4,244,048 | Tsui |
| 4,298,980 | Hajdu et al |
| 4,441,075 | McMahon |
| 4,493,077 | Agrawal et al |
| 4,476,431 | Blum |
| 4,503,537 | McAnney |
| 4,513,418 | Bardell, Jr. et al |
| 4,519,078 | Komonytsky |

The prior testing methodologies are generally capable of testing at the component, assembly, and system levels and may be summarized as follows:

A. Component Level Testing

Finite Stage—testing of a simple digital component by providing appropriate logic states to inputs and checking the output patterns Self Oscillation—testing of a device by feeding the outputs of a component back into the inputs and monitoring the output patterns Signature Analysis—applying test patterns to input lines and insuring that output patterns are correct Self Comparison—applying known or random patterns in parallel to a "good" component and the component under test by comparing outputs Level Sensitive Scan Design (LSSD)—an approach which changes the memory circuits (flip-flops) into a shift register latch. Known patterns are then circulated through the shift register portion of the memory circuit and the outputs of the gates and registers are observed at the output lines. This approach may be used as a built-in-test.

Linear Feedback Shift Register—a BITE approach referred to as a built in logic block observer (BILBO). This technique uses a separate linear sequence generator to generate the input test patterns as well as built-in check word registers for output checking Advanced LSSD/BILBO Designs—a BITE approach which uses linear sequence generators as inputs and signature analysis circuits on the outputs.

B. Assembly Level Testing

The primary testing methodologies at this level are signature analysis, self comparison, and advanced LSSD/BILBO designs described above.

C. Equipment and System Level Testing

Monitoring Operational Modes—applying inputs and checking outputs

Computer Simulation and Check—a BITE approach for systems with computer architectures to detect faults down to the replaceable assembly level. Major operational functions are then initiated and subsequent processing results are checked and in some cases analyzed.

Diagnostic testing below the component or replaceable assembly level is normally not necessary in on-line manufacturing or maintenance operations. Accordingly, a test methodology need not define the specific fault or faults of a unit under test in order to be effective. This fact can and does simplify the testing problem considerably for complex systems.

While the prior testing techniques outlined above operate satisfactorily, they are seldom capable of achieving levels of test above 95 percent for complex logic, even with disassembly and special test equipment. This is due to the practicality of running a large number of additional tests, each of which would contribute a relatively small improvement in the total level of test toward the 100 percent goal. On the other hand, the current BITE algorithms and techniques are normally not as capable of providing a thorough test or as many tests, but would be capable of operation at the normal clock rates. This is a very desirable and even necesary feature in many high speed components and systems.

Digital logic circuit designs generally include a plurality of storage elements (flip-flops, registers, latches, etc.) which store a "one" or a "zero" from one clock time to the next and gate devices (ands, ors, nors, nans, etc.) which receive their inputs from the storage elements and generate the logic decisions which take place at the next clock time. Logic circuit designers prefer to optimize and minimize their digital logic designs to perform the desired functions with a minimum number of circuits. This usually takes a logic structure or form called sequential circuits typically involving feedback loops and delays which make them difficult to test.

A sequential circuit employs memory elements in addition to logic gates. Their outputs are a function of the inputs and the state of the memory elements. The state of the memory elements, in turn, is a function of previous inputs. As a consequence, the outputs of a sequential circuit depend not only on present inputs, but also on past inputs. Thus the circuit behavior must be specified by a time sequence of inputs and internal states.

Current built-in-test systems are oriented primarily toward the testing of combinational circuits comprising logic gates whose outputs at any time are determined directly from the present combination of inputs without regard to previous inputs. The Level Sensitive Scan Design (LSSD) cannot handle sequential circuits. As a result, logic design procedures are established which restrict the logic designer to use only combinational gating structures between their shift register latches. All control circuits can be achieved by this approach but the logic design and logic implementation become more complex and increase timing and speed problems.

Another important concept involved in the current testing systems are sequence generators. These circuits, which include a fixed number of memory circuits plus some feedback control gating, are used for the generation of predictable pseudo-random sequences. The most widely used are linear sequence generators which have mathematically predictable cycle lengths based on a feedback gate structure which has a one to one mapping against the input patterns. They may or may not generate maximum length cycles but they are predictable.

Another type of sequence generator is referred to as "non-linear" sequence generator. This generator involves all combinations and permutations of feedbacks with gating structures which may or may not have one to one mappings with respect to the input feedback patterns. The cycle structures of these sequence generators are not predictable mathematically but their general characteristics can be determined by statistical means. In other words, the average size of the cycles and their number are predictable but their specific characteristics are not.

The present invention was developed in order to overcome the drawbacks of prior testing systems by providing a new cyclic analysis testing system (CATS) which will provide for the functional analysis of complex digital circuits and/or combinations of circuits, components, boards and associated interconnections to insure their proper operation and to identify faults in order to initiate repair actions. The approach involves a unique methodology which has tremendous fault detection capability with a minimum of added circuit complexity. The testing method according to the invention utilizes the actual sequential circuitry provided in a replaceable unit under test as a non-linear binary sequence generator which can then generate a testing cycle and remember its own faults by knowledge of its own unique error-free cycle structure. A simple test of the sub-system's cyclic position can then provide a GO/NO GO indication of the unit's health and functional capability which would be sufficient for all subsequent manufacturing or repair operations.

SUMMARY OF THE INVENTION

Accordingly, it is a primary object of the present invention to provide a method and apparatus for testing integrated circuits, boards, and assemblies having a plurality of inputs, outputs, and logic devices. Each logic device includes a plurality of logic gates and memory elements and could be tested either separately or in place (in-situ). In accordance with the invention, the logic devices under test are isolated from the inputs and therefore from the remaining logic devices and are configured to include all circuits under test and to simulate a non-linear binary sequence generator. The memory elements of the logic device under test are next preset to a known start setting(s), and the logic device is then clocked for a given number of steps to define a testing cycle. During the cycle, the logic gates and memory elements of the logic device under test are operated as the non-linear binary sequence generator. Such a generator has a unique error free cycle structure, whereby the memory devices achieve known settings under fault free operating conditions and different settings under fault conditions. The settings of the memory devices following the testing cycle are compared with the known fault free settings and a fault condition is indicated when the settings differ from the known settings.

According to a more specific object of the invention, data switch elements are connected with each of the circuit inputs and are operable to isolate the logic device under test. A feedback connection from the outputs of the logic device under test to the inputs of the data switch elements enables the logic device to include all circuits under test in the operation of the non-linear binary sequence generator.

It is yet another object of the invention to provide a built-in control device which is connected with each of the data switch elements. The control device operates each of the data switch elements to isolate the logic device under test and also controls the presetting, clocking, and comparing steps of the testing system.

According to a further object of the invention, the testing system can be built into the integrated circuit device and would not require the generation of special input test patterns or signature analysis of output patterns. Rather, the testing system is self-diagnostic in that it generates its own analysis cycle and remembers its own faults.

It is a further object of the invention to provide a testing system which may be initiated and monitored from a remote location via a communication link.

BRIEF DESCRIPTION OF THE FIGURES

These and other objects of the present invention will become apparent from a study of the following specification when viewed in the light of the accompanying drawing, in which:

FIG. 5 is a simplified block diagram of an LSI array with sequential circuits having a built-in test system according to the invention;

FIGS. 6 and 7 are block diagrams of combinational and sequential circuits, respectively, which comprise the logic devices of the LSI array of FIG. 5;

FIG. 8 is a detailed circuit diagram of a typical data switch of the built-in test system;

DETAILED DESCRIPTION

Figure 1:
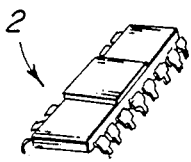
FIGS. 1, 2, 3 are perspective views of a circuit component comprising an LSI array, a circuit board including a plurality of components, and a circuit assembly comprising a plurality of boards, respectively, all of which are testable by the subject invention.
Figure 2:
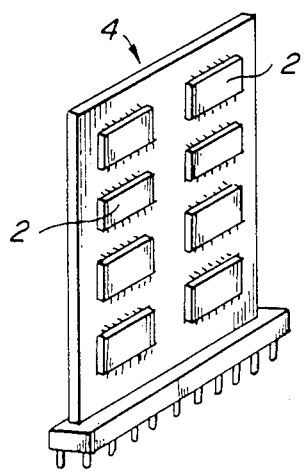
Figure 3:
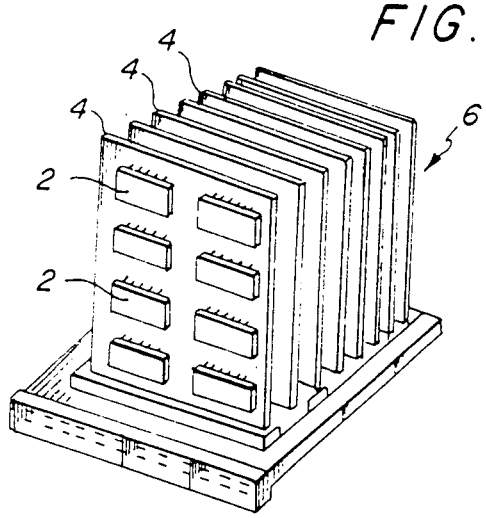

Referring first to FIGS. 1-3, the present invention may be used to test a circuit component 2, a circuit board 4, or a circuit assembly 6. A typical circuit component comprises an LSI array having on the order of 100 flip flops or memories, 300 logic gates, 6000 active devices, 25 inputs including power and clock plus 25 outputs. A simplified block diagram of an LSI array having a built-in-test system is shown in FIG. 5.

The circuit board 4 of FIG. 2 typically includes a plurality of interconnected components or LSI arrays 2. A plurality of circuit boards 4 may be interconnected to form an assembly 6 shown in FIG. 3. The present invention may be used to test a component, a board, or an assembly.

The circuit component, board, and assembly are all replaceable units. Normally, all of the units would be tested simultaneously. However, multiple sequential levels of testing may be provided at a minimum increase in complexity. This would identify faults at the component level, then, at the board level, and finally at the assembly level. Assembly level testing would identify failures in the components and boards, as well as in the connectors, plugs, and control gates which otherwise might not be tested. While this level of test would not identify which specific component or board was at fault, it may be used to insure that all data switches added for testing purposes are functioning properly.

Figure 4:
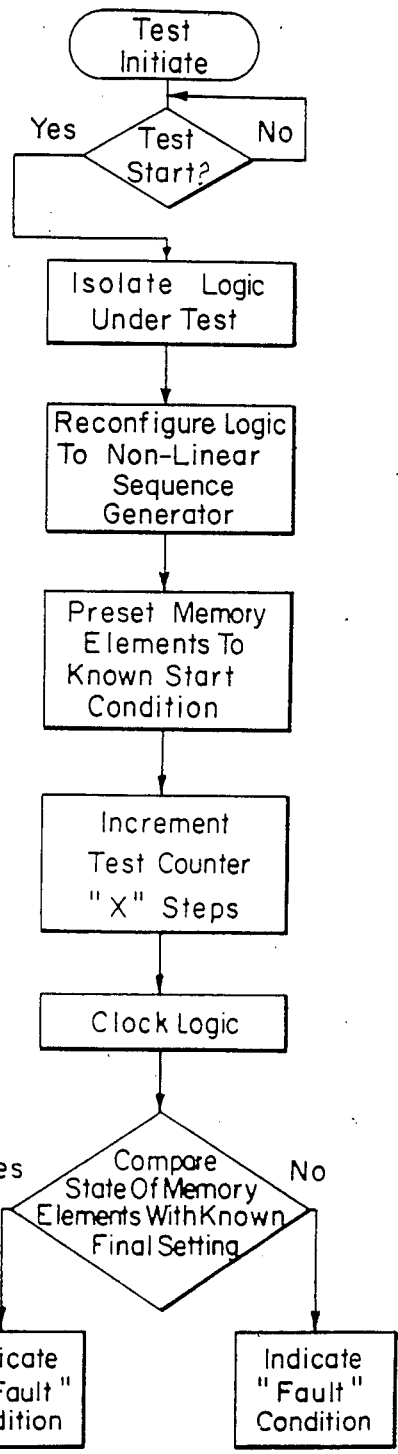
FIG. 4 is a block diagram illustrating the steps comprising the testing method according to the invention.

Referring now to FIG. 4, the testing method according to the invention will be described. Once the testing operation is initiated, the logic device under test is isolated from the external inputs to the circuit. The logic device under test is then reconfigured by connecting output circuits back into the input circuits. The memory elements of the logic device are preset into a known start setting, following which the logic device under test is clocked a given number of steps to define a testing cycle in order to operate the logic gates and memory elements of the device as the non-linear binary sequence generator. From computer simulation or the like, the settings of the memory elements after a predetermined number of steps corresponding to the number of steps in the testing cycle can be determined or "known" when the logic gates and memory elements operate in a normal "fault free manner". Accordingly, at the end of the testing cycle, the settings of the memory elements are compared with the known settings. Where the settings are different, a fault is indicated, whereby the testing operator will know that the device under test should be replaced.

The testing method, according to the invention, will be discussed in greater detail in conjunction with the apparatus used to perform the test.

In FIG. 5, there is shown in more detail an LSI array or component 2. The array includes a plurality of inputs 8 and a plurality of outputs 10. Each array also includes a plurality of logic devices 12 which comprise combinational circuits C. As shown in FIG. 6, a combinational circuit comprises one or more logic gates 14 without memory elements and having inputs I and outputs O. A sequential circuit, on the other hand, as shown in FIG. 7, comprises one or more combinational circuits having one or more memory elements 16 connected in a feedback path, and also including inputs I and outputs O. As noted above, the output of a sequential circuit is a function of the input and the state of the memory elements. The state of the memory elements, in turn, is a function of previous inputs. The typical LSI array of FIG. 5 is a sequential logic circuit which includes a plurality of flip-flop memory circuits 18 which constitute the stages of a non-linear sequence generator. The circuit designer dictates the arrangement and interconnection of the logic devices 12 and the flip-flops 18.

The testing system according to the invention is normally built into the array by the circuit designer and requires only a very small percentage increase of the circuit architecture, thereby minimizing the cost and complexity of the testing methodology. Essentially, the testing system includes a built-in-test controller 20 and a plurality of data switches 22. More particularly, one data switch 22 is connected with each input 8, and all of the data switches 22 are connected with the controller 20. The data switches, under control of the controller, are operable to isolate the logic device under test from the other logic devices in the equipment and from any external input with which it is connected. Isolation is required to insure that a fault in one replaceable unit under test does not propagate to other logic assemblies. If error propagation did occur, it would make the identification of a faulty unit impossible to detect.

Figure 13:
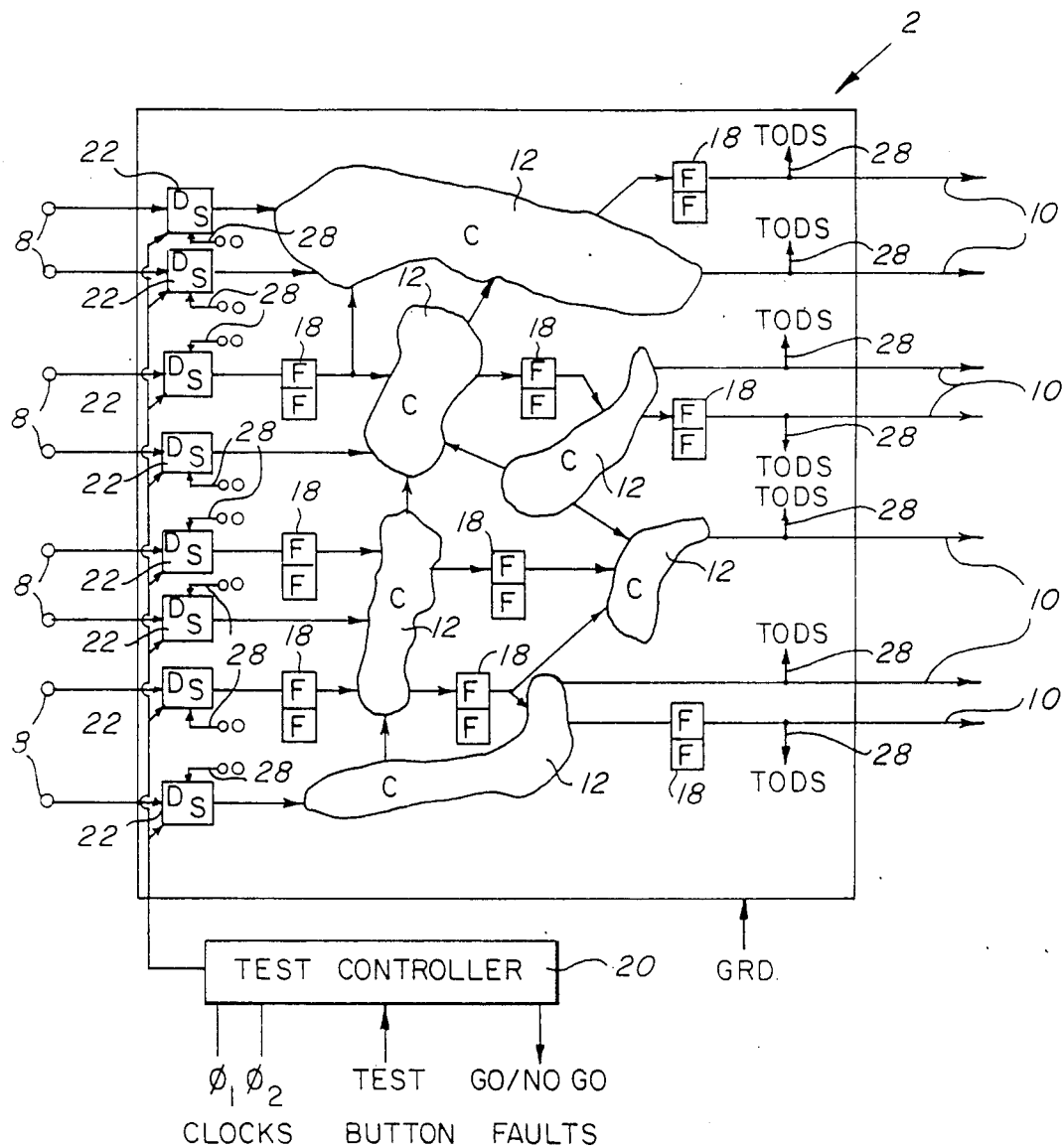
FIG. 13 is a block diagram similar to FIG. 5 illustrating external control of an LSI array.

Alternatively, the testing system of the present invention may be designed as a separate tester adapted for connection with LSI or VLSI. The separate tester would essentially comprise an external controller and a plurality of data switches including feedback lines as shown in FIG. 13. The separate tester would operate in a manner similar to the testing system built into the array.

As shown in FIG. 8, each data switch 22 includes two logic devices 24 each having two inputs, with the outputs of the logic devices being connected with an OR summing circuit 26 whose output is connected with the logic device under test. One input to one of the data switch gate comprises the external input 8. A no test/test signal from the controller is delivered to one input of each data switch logic device. Finally, a feedback signal from the output of the logic device under test is delivered to the remaining input of the data switch logic device. The test/no test input to the data switch enables or disables the data switch to isolate the logic under test from its normal input while simultaneously connecting the output feedback circuit.

Figure 9:
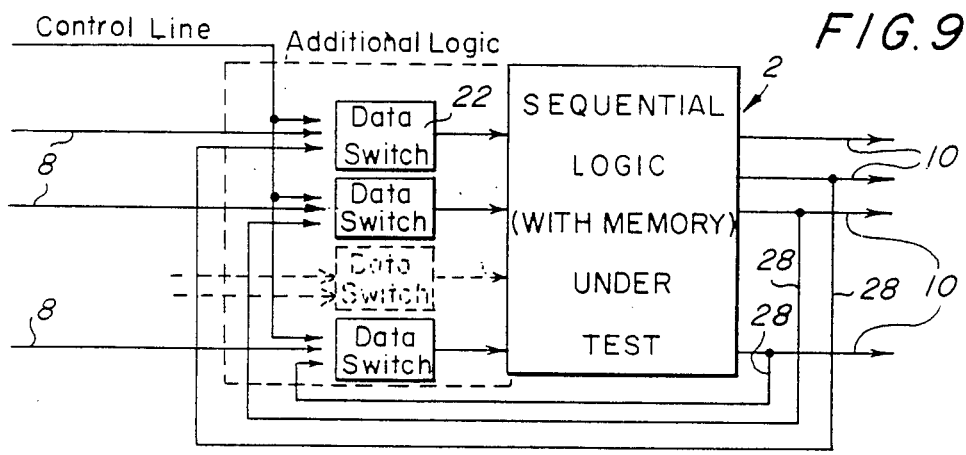
FIG. 9 conceptually illustrates reconfiguration of the logic device under test to simulate a non-linear binary sequence generator.

As set forth above and as shown in FIGS. 5 and 9, at the output of the logic device under test, a feedback line 28 is connected with the input to the data switches whose outputs are connected with the logic under test. In this manner, the logic device under test is reconfigured to allow the output circuits to be included in the operation of the non-linear binary sequence generator. If the number of output lines is greater than the number of inputs, they would be combined together by MOD-2 addition or a similar process so that every output influences an input. If the number of inputs is greater than the number of outputs, one or more outputs could be used to drive more than one input. The sequential logic within the logic device under test would not require modification to operate as a non-linear binary sequence generator. Rather, each memory register within the logic device would be conceptually considered as a register in the sequence generator for test purposes only.

The cyclic properties of the sequence generator are analyzed as a function of the total number of logic gates and their logic states. A table would be generated during this analysis which would indicate which gates had functioned and in which manner. Thus, a total fault analysis profile can be developed which would indicate the test functions which would be exercised while the non-linear binary sequence generator is stepping through a particular part of its cycle. This analysis could indicate that certain portions of a particular logic would not be fully tested due to a particular logic function which was slow to change; i.e., a long binary counter which may have stages which seldom change state.

Under these circumstances, a test control gate may have to be added in order to break up these logic configurations into smaller, more active, logic configurations which would exhibit more change and therefore greater testability.

During the equipment design phase, therefore, the cycle properties of this non-linear sequence generator can be analyzed to determine the fault detection properties of different parts of the cycle as well as different testing times and feedback connections. The variable functions will allow for optimum selection of a test cycle. The use of the known sequential stepping properties or cycle structure of such a logic configuration characterizes the present invention. The memory registers, therefore, act to remember any fault which might occur at any time during the test cycle since the system will deviate from its known cycle structure and remain so during the rest of the test mode.

Figure 10:
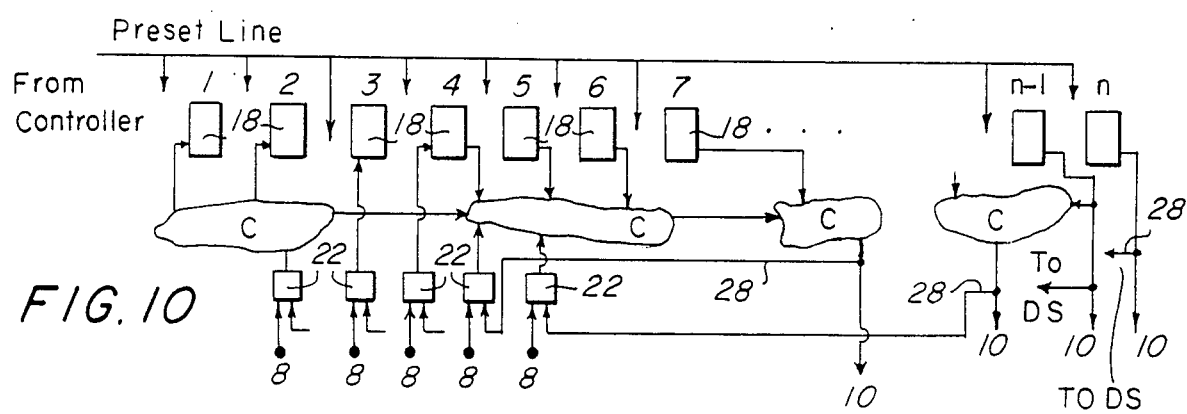
FIG. 10 is a block diagram representing the presetting of the memory elements of the logic device under test.

The controller 20 includes a preset mechanism as shown in FIG. 10 to deliver a signal to each of the memory elements 18 of the logic circuit under test to a known start position. Preferably, the setting would be chosen to utilize the normal preset lines or other initializing circuits of the array. Presetting the memory elements places the sequence generator at a particular binary known point in its stepping cycle. The preset would normally be built into the equipment during the design phase.

Figure 11:
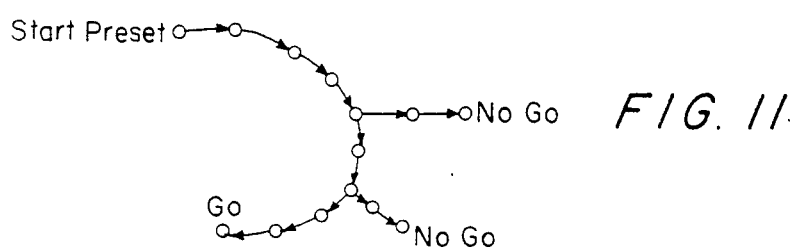
FIG. 11 is a diagrammatic representation of a testing cycle.

Under control of the controller 20, the logic device under test is clocked at its normal clock rate for a fixed number of steps which defines a testing cycle. The memory elements contain the pseudo-contents of the non-linear sequence generator. The gates and associated inputs into the memory elements operate in their normal manner with a few relatively minor exceptions (required to break up slow moving logic configurations). The basic testing procedure relates to the fact that if a fault or error occurs, the binary sequence generator will step off its normal cycle into a totally different cycle as shown in FIG. 11 with a minimum probablilty of its eventual return to its proper state, thus indicating a fault condition. If, on the other hand, all of the gates operate correctly, the sequence generator will step along its normal cycle indicating correct operation.

It should be recognized that if a gate structure is operated in all its logic states without error, it indicates that all of the active devices, inactive devices and interconnections must be operational, since all gates operate in unison to provide for the operation of the non-linear sequence generator. The registers and gates together perform a logic function which would not operate correctly unless every gate was operating in its correct manner.

The test cycle operates for a convenient period of time depending on the error detection goal as well as some convenient counter which may be available for some other purpose. The length of the count would be fixed. Accordingly, the setting of the memory elements, if every gate operated correctly during the total time of test, will be known or may be derived by computer simulation. If the setting is different, an error has occurred at some point in the cycle. In general, the longer the test sequence, the higher the level of test provided.

Typical test cycles may comprise thousands to tens of thousands of steps.

Figure 12:
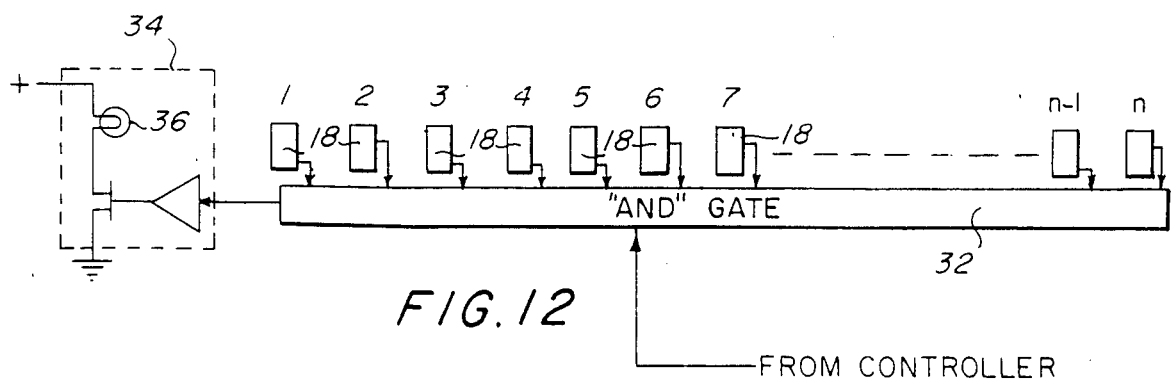
FIG. 12 is a schematic representation of the comparing and fault indicating means according to the invention.

Referring now to FIG. 12, the setting of each memory element 30 is sensed or detected and compared with the known setting by an AND gate 32 under control of the controller 20. As a practical matter, the AND gate may sense only a fractional portion of the memory devices in order to provide enough accuracy for a particular testing application.

Where the settings of the memory elements corresponds with the known settings, it is apparent that the logic device under test is operating properly and that no fault conditions exist in the circuit. On the other hand, where the settings of the memory elements following the testing cycle differ from the known settings, the AND gate produces a fault output which is delivered to a fault indicator 34. The fault indicator includes an indicator light 36 which is illuminated when a fault condition is present.

Referring once again to FIG. 5, the built-in-test controller is normally activated by a testing device such as a test button which enables the controller to begin the testing sequence. The test button may be manually operated by testing personnel who monitor the indicator following the test to ascertain the operability of the device under test. Alternatively, the test button may be actuated from a remote location by a signal transmitted via a communication link. Similarly, fault indications, or the lack thereof, may be detected at a remote location.

Following completion of a test of a first logic device, a subsequent device, board, or assembly may be tested using a similar method and apparatus. More particularly, the next logic device under test is isolated and reconfigured to simulate a non-linear binary sequence generator. The memory elements are preset to a start position, the device is clocked, and the settings of the memory elements are compared with known settings. Repeated testing cycles may be performed for the number of devices to be tested. In many systems, it may be possible to design all logic devices to have similar times to test. Under these circumstances, all of the logic devices in an equipment could be tested simultaneously and the results read sequentially out of the test control logic.

With some modifications, the testing method and apparatus according to the present invention may be used to test digital processing systems based on computer architectures. Digital processing systems normally present some unique testing problems. These problems relate to the almost constant transfer of blocks of data from one logic unit to another. In addition, many systems have buss type interconnections which operate as both input and output lines. In order to test such systems, the clocking operation of the present invention is modified to provide a two phase test sequence in order to fully test the buss structures in both input and output states. This requires that one test cycle be performed where an input/output buss would be configured first as an input and then without modification of the setting in the registers, a second test cycle would be performed where the buss is configured as an output circuit. Furthermore, the test cycle structure should be designed in such a manner that the program counter of the computer sequences through its complete cycle as part of the test cycle to insure that the firmware or software under test is fully exercised during the test. Finally, the data and program memories would have to be filled with information that is known and the influence of the data memory on the final contents of the non-linear binary sequence generator setting would be calculated in advance to indicate proper operation.

In order to accomplish the above, an additional ROM may be necessary for test control functions which would assist in the full operation of the program counter. In addition, a small linear binary sequence generator could be used to generate known fill information for the date memory if required.

This same sequence generator could be used to compare the data output from the data memory as it processes through a complete memory readout. In this case, the ideal test cycle would run through the data test sequence twice—first in normal sequence then in an inverted data sequence. This would test all stages of the memory in both a zero and a one state. If the data contents are known, this step would be unnecessary. If a number of software programs required testing, the program memory could be used to store the initial memory contents as well as the final condition of the memory registers (GO/NO GO setting) which could be stored in a special test register and used for the final comparison and subsequent GO/NO GO decision.

Fault tolerant computing systems normally accomplish their goal by having redundant systems which can be switched into operation in case of a failure. The GO/NO GO decision associated with the above computer test sequence would provide for the high level of test required of both the hardware and associated critical firmware and/or software for such critical operational hardware.

Critical systems may require that the test GO/NO GO circuits be provided with additional test checks to insure correct operation. This can be accomplished by pulsing the detect circuits twice: first at the beginning of test to create a fault signal into a two bit binary counter; and second, the regular pulse forces the first stage into the correct condition. The detector on the first two stages would also detect that action has occurred in the test detection logic.

While in accordance with the provisions of the Patent Statute, the preferred form and embodiments of the invention have been illustrated and described, it will be apparent to those skilled in the art that various changes and modifications may be made without deviating from the inventive concepts set forth above.

What is claimed is:

1. A method for testing an integrated circuit including a plurality of inputs, a plurality of outputs, and a plurality of logic devices connected between the inputs and outputs, each of the logic devices including a plurality of logic gates and memory elements, comprising the steps of
    (a) isolating a first logic device to be tested from the remaining logic devices by turning off all external circuit inputs;
    (b) reconfiguring said first logic device to include all logic gates and memory elements to simulate a non-linear binary sequence generator;
    (c) presetting the memory elements of said first logic device to a known start setting, respectively;
    (d) clocking said first logic device for a given number of steps to define a testing cycle to operate the logic gates and memory elements as the non-linear binary sequence generator, the memory elements achieving a known setting under normal operating conditions and a different setting under fault conditions;

(e) comparing the settings of the memory elements after the testing cycle with the known setting; and (f) indicating a fault condition when the settings differ from the known setting.

2. A method as defined in claim 1, wherein steps (a) through (f) are repeated for subsequent logic devices in the integrated circuit.

3. A method as defined in claim 2, and further comprising the step of controlling said isolating, presetting, clocking, and comparing steps.

4. A method as defined in claim 2, wherein said isolating step includes connecting a data switch with each input to a logic device on an integrated circuit under test and controlling the data switches to disconnect the input from the logic device under test during the testing operation.

5. A method as defined in claim 4, and further comprising the step of initiating the test sequence from a remote location.

6. A method as defined in claim 4, wherein said logic device has inputs from a buss structure which operates as an input/output device, and further comprising the step of doubling the testing cycle, whereby said buss structure is treated as an input circuit during the first testing cycle and as an output circuit during the second testing cycle.

7. A method as defined in claim 6, wherein steps (a) through (f) are performed internally to provide built-in-test of the integrated circuit device.

8. A method as defined in claim 1, wherein steps (b) through (f) are performed externally to the integrated circuit device by a separate testing device.

9. A method as defined in claim 1, and further comprising the step of presetting the memory elements to a plurality of known start settings each having known stop settings following normal fault-free operation.

10. Apparatus for testing an integrated circuit including a plurality of inputs, a plurality of outputs, and a plurality of logic devices connected between the inputs and outputs each of the logic devices including a plurality of logic gates and memory elements, comprising (a) means connected with each input for isolating a first logic device under test from external signals applied via the inputs of the remaining logic devices;

(b) test controller means connected with each of said isolation means and with said first logic device for controlling the testing sequence of said logic device, said controller means including (1) means for reconfiguring said logic device to include all logic gates and memory elements to simulate a non-linear binary sequence generator;

(2) means connected with said memory elements for presetting said memory elements to a known start setting;

(3) means for clocking said logic device for a given number of steps to define a testing cycle to operate the logic gates and memory elements as a non-linear binary sequence generator, the memory elements achieving known settings under normal operating conditions and different settings under fault conditions;

(4) means connected with said memory elements for sensing the settings of the memory elements after the testing cycle and for comparing the settings with the known setting; and (c) indicator means connected with said comparing means for indicating a fault condition when the settings of the memory elements are different from the known setting.

11. Apparatus as defined in claim 10, wherein said isolation means comprises a plurality of data switch elements connected with the inputs, respectively.

12. Apparatus as defined in claim 11, and further comprising a plurality of feedback circuits connecting the outputs of said logic device with the inputs to said data switch elements, respectively, whereby said logic device is reconfigured to include all logic gates and memory elements to simulate a non-linear sequence generator and further whereby said memory elements detect and store any faults during the testing clock cycle.

13. Apparatus as defined in claim 12, wherein said comparing means comprises an AND gate.

14. Apparatus as defined in claim 13, and further comprising input/output buss means connected with the inputs, and further wherein the test cycle is doubled, whereby said buss means is treated as an input circuit during the first testing cycle and as an output circuit during the second testing cycle.

15. Apparatus as defined in claim 14, and further comprising means for actuating said controller means for initiating a testing cycle.

16. A method for testing a logic device of a digital integrated circuit, the logic device including an input, an output, and a plurality of logic gates and memory elements connected therebetween, comprising the steps of (a) reconfiguring the logic device under test to include all logic gates and memory elements by feeding the output back to the input, thereby simulating a non-linear binary sequence generator;

(b) presetting the memory elements of the logic device to a known start setting, respectively;

(c) clocking the logic device for a given number of steps to define a testing cycle to operate the logic gates and memory elements as the non-linear binary sequence generator, the memory devices achieving a known setting under normal operating conditions and a different setting under fault conditions;

(d) comparing the settings of the memory elements after the testing cycle with the known setting; and (e) indicating a fault condition when the settings differ from the known setting.

* * * * *